United States Patent [19]

Nanamiya

[11] Patent Number: 5,657,269

[45] Date of Patent: Aug. 12, 1997

[54] SEMICONDUCTOR STORAGE DEVICE HAVING ADDRESS-TRANSITION DETECTING CIRCUIT AND SENSE-DETERMINATION DETECTING CIRCUIT

[75] Inventor: Yoshitomo Nanamiya, Hamamatsu, Japan

[73] Assignee: Yamaha Corporation, Hamamatsu, Japan

[21] Appl. No.: 512,679

[22] Filed: Aug. 8, 1995

[30] Foreign Application Priority Data

Aug. 9, 1994 [JP] Japan ................... 6-208009

[51] Int. Cl.⁶ .................... G11C 11/34; G11C 8/00
[52] U.S. Cl. .................. 365/185.17; 365/185.2; 365/233.5; 365/194
[58] Field of Search ............. 365/185.17, 185.2, 365/233.5, 194

[56] References Cited

U.S. PATENT DOCUMENTS

| | | | |
|---|---|---|---|
| 4,800,304 | 1/1989 | Takeuchi | 365/194 X |
| 5,327,394 | 7/1994 | Green et al. | 365/233.5 |
| 5,457,661 | 10/1995 | Tomita et al. | 365/194 X |

Primary Examiner—David C. Nelms
Assistant Examiner—Huan Hoang
Attorney, Agent, or Firm—Loeb & Loeb LLP

[57] ABSTRACT

A semiconductor storage device is basically configured similar to a mask ROM which comprises a memory cell array, an address buffer, a row decoder, a column decoder and a sense amplifier circuit. The semiconductor storage device is specifically designed to deal with addresses which are sequentially inputted thereto in synchronization with address cycles without a margin of time. An address-transition detecting circuit is provided to detect an address transition which occurs at a change of the address cycles. A sense-determination detecting circuit detects the sense determination of the sense amplifier circuit on the basis of the address transition so as to produce a control signal. A data latch circuit latches the output of the sense amplifier circuit in accordance with the control signal. The control signal is determined in such a way that the output of the sense amplifier circuit is latched by the data latch circuit in synchronization with the address cycles in turn. Since no margin of time is required by the address cycles, it is possible to perform high-speed read-out operations on the memory cell array. Moreover, the sense-determination detecting circuit uses delay circuits containing dummy cell arrays which are configured similar to the memory cell array, so it is possible to accurately and automatically measure the time which elapses until the sense determination of the sense amplifier circuit.

3 Claims, 6 Drawing Sheets

5,657,269

SEMICONDUCTOR STORAGE DEVICE HAVING ADDRESS-TRANSITION DETECTING CIRCUIT AND SENSE-DETERMINATION DETECTING CIRCUIT

BACKGROUND OF THE INVENTION

1. Field of the Invention

The present invention relates to semiconductor storage devices which are used as mask ROMs.

2. Prior Art

A variety of semiconductor storage devices have been developed and the scale of integration of storage devices has increased in response to improvement in fine processing technologies. Large-scale semiconductor storage devices have increased resistance of internal wires, so delay of internal signals becomes large. Thus, in large-scale semiconductor storage devices it is difficult to perform high-speed access. An access time of a semiconductor storage device is the time which is required until data output is determined in accordance with an inputted external address. Normally, a cycle for inputting the external address is restricted by the access time, so a cycle time is set by adding a certain margin of time to the access time. In order to shorten the access time, a variety of measures have been employed. For example, bit-line precharging has been employed.

However, due to the existence of delay elements, it is difficult to further shorten the access time. Among those delay elements, is included delay due to word lines, delay due to operations of sense amplifiers and delay due to output capacity. In the case of mask ROMs and EPROMs which use NAND-type memory cells, large-scale integration may be easy, but high-speed operations are difficult to realize.

SUMMARY OF THE INVENTION

It is an object of the present invention to provide a semiconductor storage device which is capable of performing high-speed read-out operations.

A semiconductor storage device of the present invention is basically configured similar to a mask ROM which comprises a memory cell array, an address buffer, a row decoder, a column decoder and a sense amplifier circuit. The semiconductor storage device is specifically designed to deal with addresses which are sequentially inputted thereto in synchronization with address cycles without a margin of time. In order to achieve this, the semiconductor storage device includes three types of circuits as follows:

An address-transition detecting circuit is provided to detect an address transition which occurs at a change of the address cycles. A sense-determination detecting circuit detects the sense determination of the sense amplifier circuit on the basis of the address transition so as to produce a control signal. A data latch circuit latches the output of the sense amplifier circuit in accordance with the control signal. The control signal is determined in such a way that the output of the sense amplifier circuit is latched by the data latch circuit in synchronization with the address cycles in turn.

Thus, the semiconductor storage device can begin to accept a next set of addresses before the last data, from a preceding set of addresses, has been outputted. Therefore, it is not necessary to provide the margin of time for the address cycles, so the semiconductor storage device can perform data-read-out operations using short address cycles, each of which is shorter than the access time.

Further, the sense-determination detecting circuit uses delay circuits containing dummy cell arrays which are configured similar to the memory cell array, so it is possible to accurately and automatically measure the time which elapses until the sense determination of the sense amplifier circuit.

BRIEF DESCRIPTION OF THE DRAWINGS

These and other objects of the subject invention will become more fully apparent as the following description is read in light of the attached drawings wherein.

DESCRIPTION OF THE PREFERRED EMBODIMENTS

Now, preferred embodiments of the present invention will be described in detail with reference to drawings.

Figure 1:
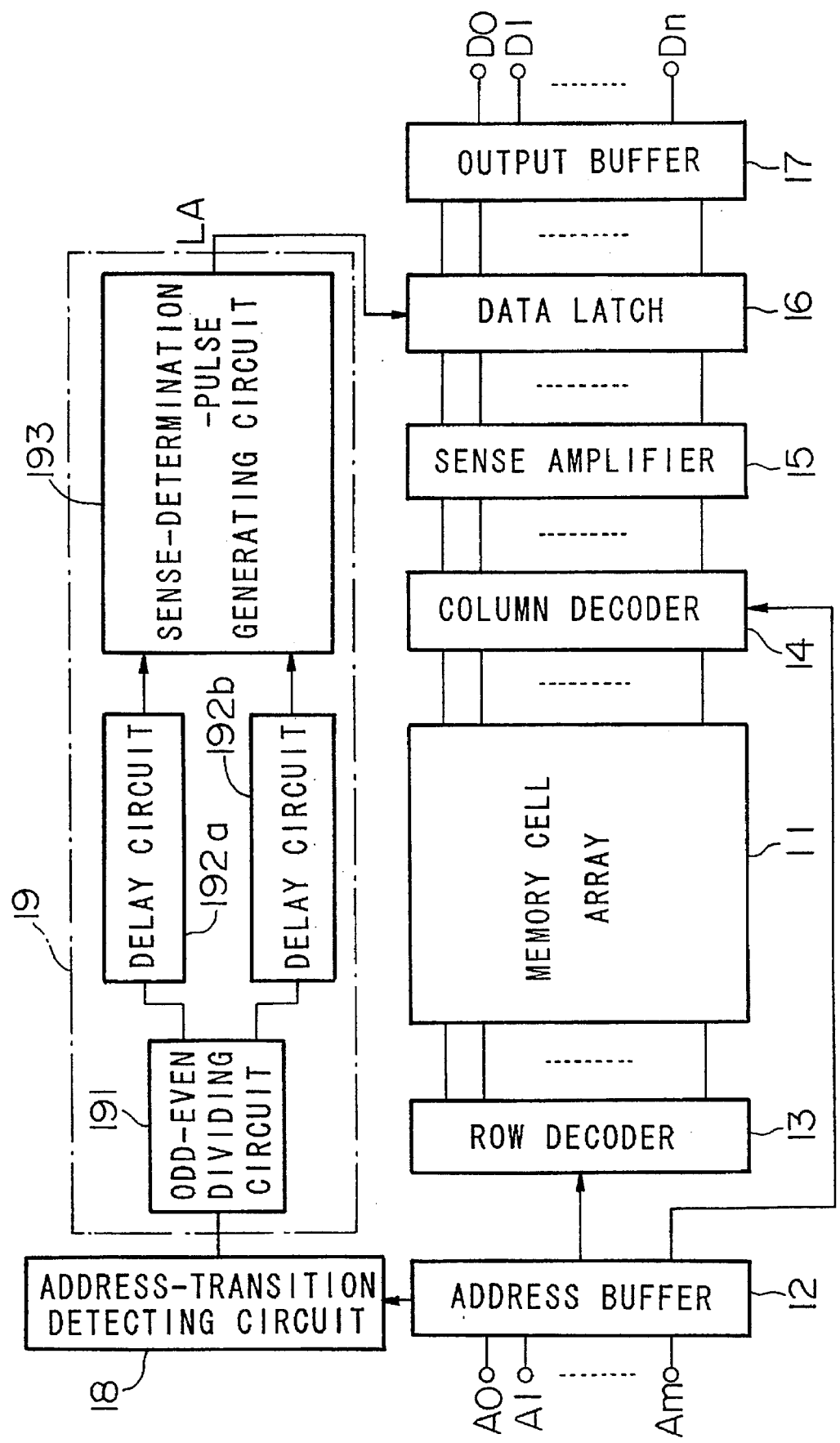
FIG. 1 is a block diagram showing an overall configuration of a mask ROM which is an embodiment of the present invention.

FIG. 1 is a block diagram showing a mask ROM which is designed in accordance with an embodiment of the present invention. The fundamental configuration of the mask ROM of FIG. 1 may be similar to that of normal ROMs. Specifically, there is provided a memory cell array 11, an address buffer 12, a row decoder 13, a column decoder 14 and a sense amplifier circuit (or sense amplifiers) 15. The memory cell array 11 stores data by mask programs; the address buffer 12 inputs an external address A0, A1 ..., Am; the row decoder 13 and the column decoder 14 perform selection of a word line and a bit line by decoding the external address; and the sense amplifier circuit 15 reads out data on the bit line selected by the column decoder 14.

Output of the sense amplifier circuit 15 is supplied to a data latch circuit 16 which inputs and temporarily retains the read out data. The data, retained by the data latch circuit 16, is supplied to external output terminals D0, D1 ..., Dn through an output buffer 17.

In order to control the timing of data transfer from the sense amplifier circuit 15 to the data latch circuit 16, an address-transition detecting circuit 18 and a sense-determination detecting circuit 19 are provided. The address-transition detecting circuit 18 detects transition of addresses which are inputted to the address buffer 12; and consequently, an address-transition timing for a certain address is detected. The sense-determination detecting circuit 19 detects delay time which elapses until output of the sense amplifier circuit 15 is determined with respect to data which are selected by the address.

The sense-determination detecting circuit 19 contains two series of delays, i.e., delay circuits 192a and 192b. In addition, the sense-determination detecting circuit 19 contains an odd-even dividing circuit 191 which divides address-transition detecting pulses, outputted from the address-transition detecting circuit 18, into odd-number pulses and even-number pulses. The delay circuit 192a receives odd-number pulses so as to detect the time which elapses until sense determination (i.e., determination of output of the sense amplifier circuit 15) with respect to data which are selected by an address corresponding to the odd-number pulse. Another delay circuit 192b receives even-number pulses so as to detect the time which elapses until the sense determination with respect to data which are selected by an address corresponding to the even-number pulse. Output signals of the delay circuits 192a and 192b are supplied to a sense-determination-pulse generating circuit 193, and sense-determination pulses are supplied to the data latch circuit 16 as latch control signals.

According to the aforementioned configuration of FIG. 1, the sense-determination detecting circuit 19 detects delay time which elapses until the sense determination after an address is input, and data from the sense amplifier circuit 15 is temporarily inputted to the data latch circuit 18; immediately thereafter, a next address can be input. In short, the aforementioned configuration enables the next address to be input before the data, which is selected by the previous address input, is finally outputted from the output buffer 17.

Next, specific configurations, which are designed by applying the present embodiment to a ROM using NAND-type memory cells, will be described with reference to FIGS. 2 to 5.

Figure 2:
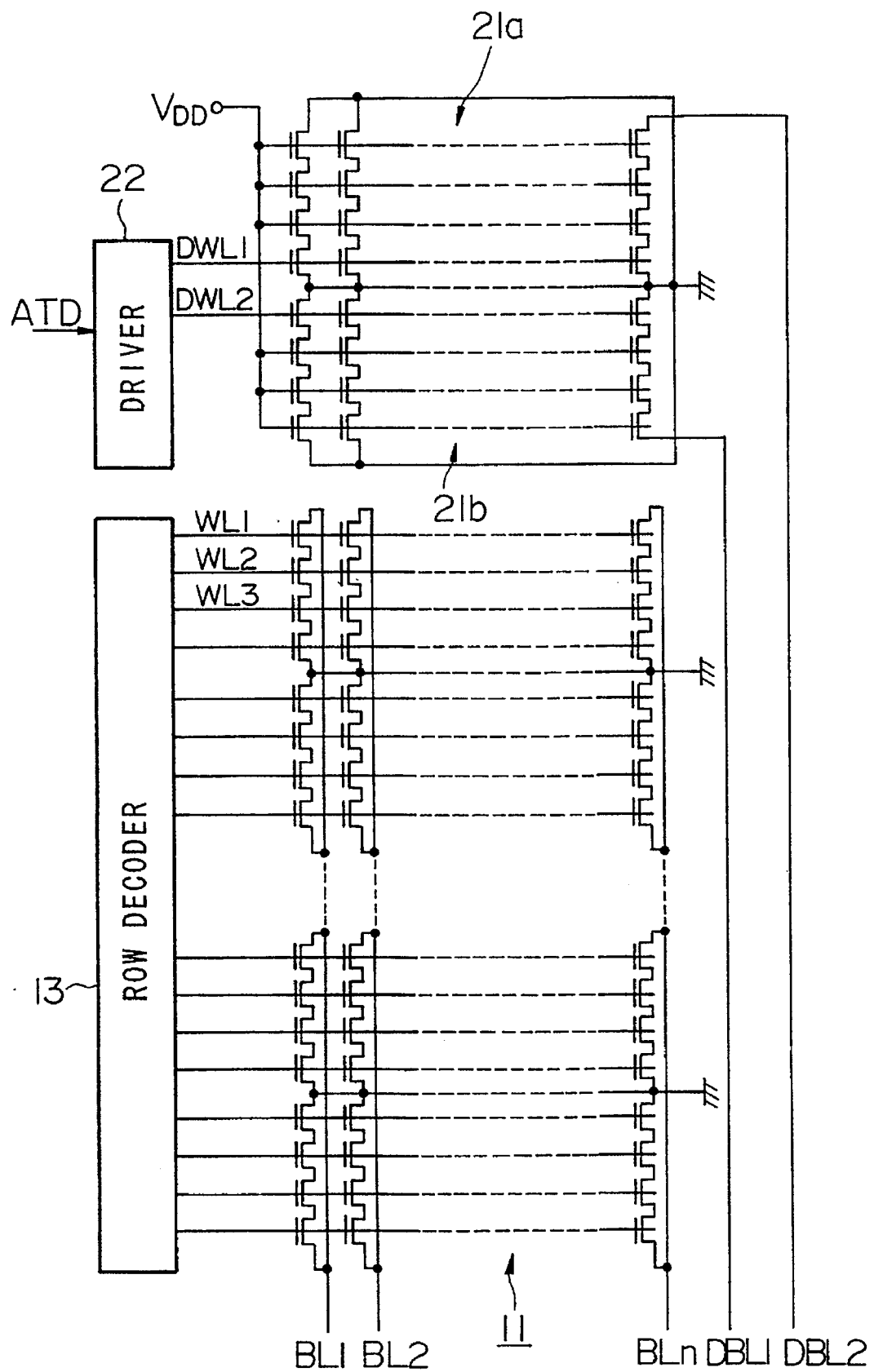
FIG. 2 is a block diagram showing a selected part of the mask ROM containing memory cell arrays and dummy cell arrays.

In FIG. 2, a memory cell array 11 is configured by NAND-type memory cells each consisting of four memory transistors. Herein, each memory transistor is set as either a transistor of enhancement type or a transistor of depletion type in accordance with stored data. Similar to the memory cell array 11, each of first and second dummy cell arrays 21a and 21b is configured by NAND-type memory cells each consisting of four memory transistors. The dummy cell arrays 21a and 21b form main parts of the delay circuits 192a and 192b, in FIG. 1, respectively.

All of the memory transistors of the dummy cell arrays 21a and 21b are set as transistors of enhancement type. Among dummy word lines provided for the dummy cell arrays 21a and 21b, dummy word lines DWL1 and DWL2, whose positions are closest to the ground position, are selectively driven by a driver 22, while the power supply voltage VDD is applied to the other dummy word lines. Only dummy bit lines DBL1 and DBL2 extend from NAND-type memory cells which are arranged at the last stages of the dummy word lines DWL1 and DWL2 respectively, while all of the other dummy bit lines are grounded.

The driver 22 contains the aforementioned odd-even dividing circuit 191 shown in FIG. 1; and the detailed configuration thereof will be described later.

Figure 5:
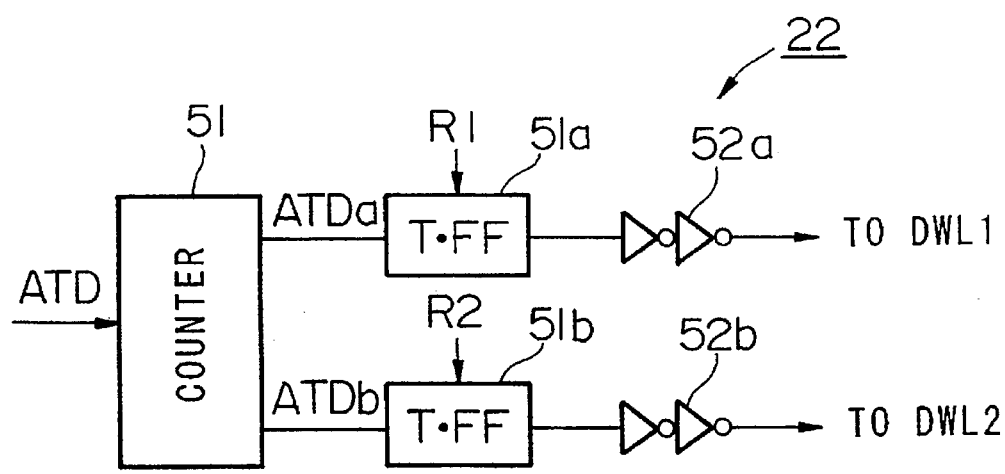
FIG. 5 is a block diagram showing an example of internal configuration of a driver in FIG. 2.

The dummy bit lines DBL1 and DBL2, which extend from the dummy cell arrays 21a and 21b respectively, are connected to a dummy sense amplifier circuit S2 through a dummy column selector 31 as shown in FIG. 5. The column decoder 14 and the sense amplifier circuit 15 are provided for the memory cell array 11, wherein the dummy column selector 31 is configured similar to the column decoder 14, and the dummy sense amplifier circuit 32 is configured similar to the sense amplifier circuit 15.

Figure 3:
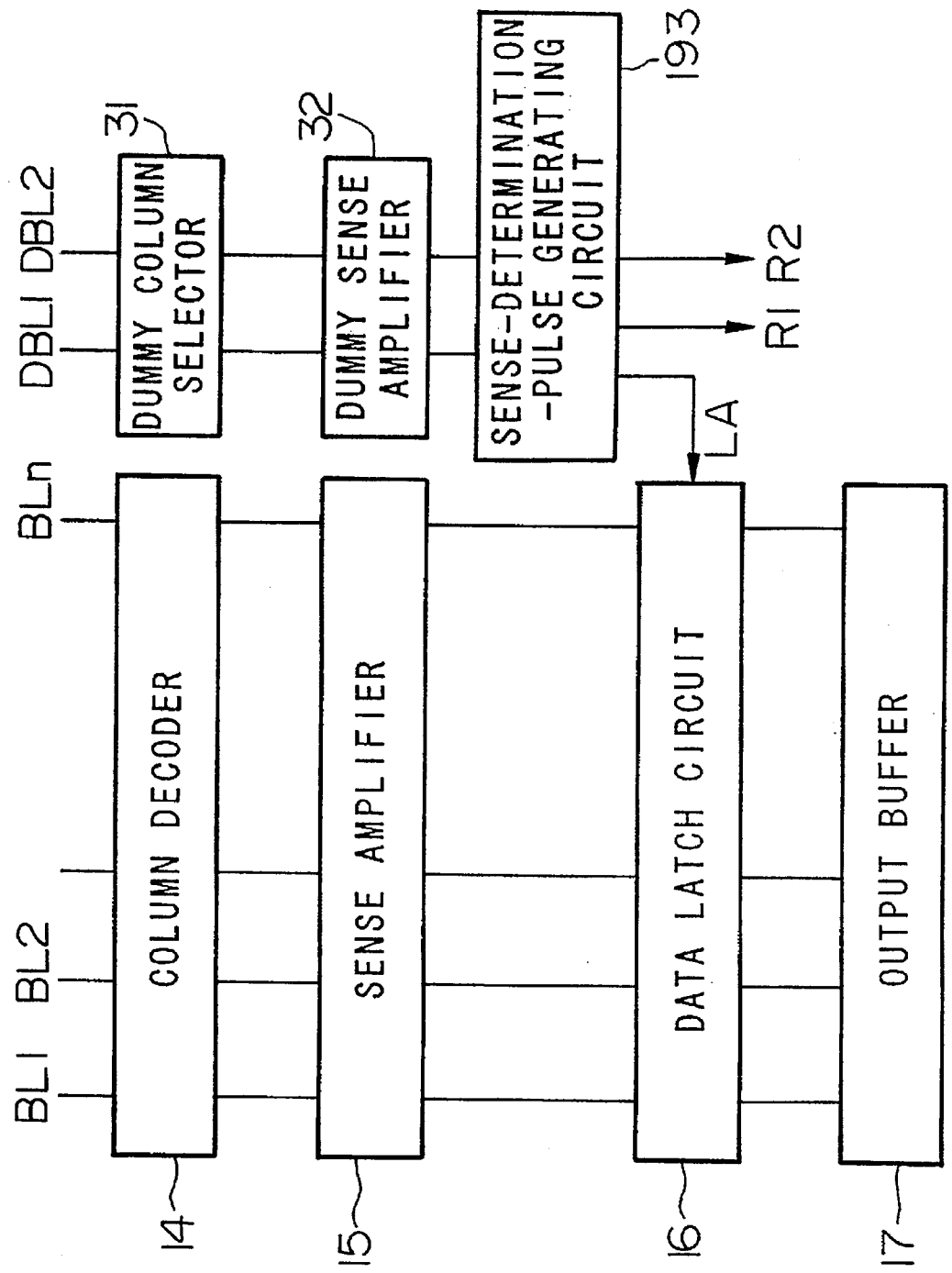
FIG. 3 is a block diagram showing another part of the mask ROM which relates to dummy bit lines extended from the dummy cell arrays in FIG. 2.

The delay circuits 182a and 192b, in FIG. 1, are configured by the dummy cell arrays 21a and 21bin FIG. 2, as well as the dummy column selector 31 and the dummy sense amplifier circuit 32 in FIG. 3.

The reason that the dummy bit lines DBL1 and DBL2 extend from the NAND-type memory cells, which are connected at the last stages of the dummy word lines DWL1 and DWL2, is to provide a delay time corresponding to the maximum delay at the word lines of the memory cell array 11. The dummy column selector 31 and the dummy sense amplifier circuit 32 are provided to detect an accurate time that is required until the sense determination, under consideration of delay of the column decoder 14 and the sense amplifier circuit 15 which are provided for the memory cell array 11.

Specifically, the dummy sense amplifier circuit 32 is configured by a pair of sense amplifiers which are provided respectively for the dummy bit lines DBL1 and DBL2. Thus, the sense-determination-pulse generating circuit 193 generates sense-determination pulses, each having a certain pulse width, based on the output of the dummy sense amplifier circuit 32.

Figure 4:
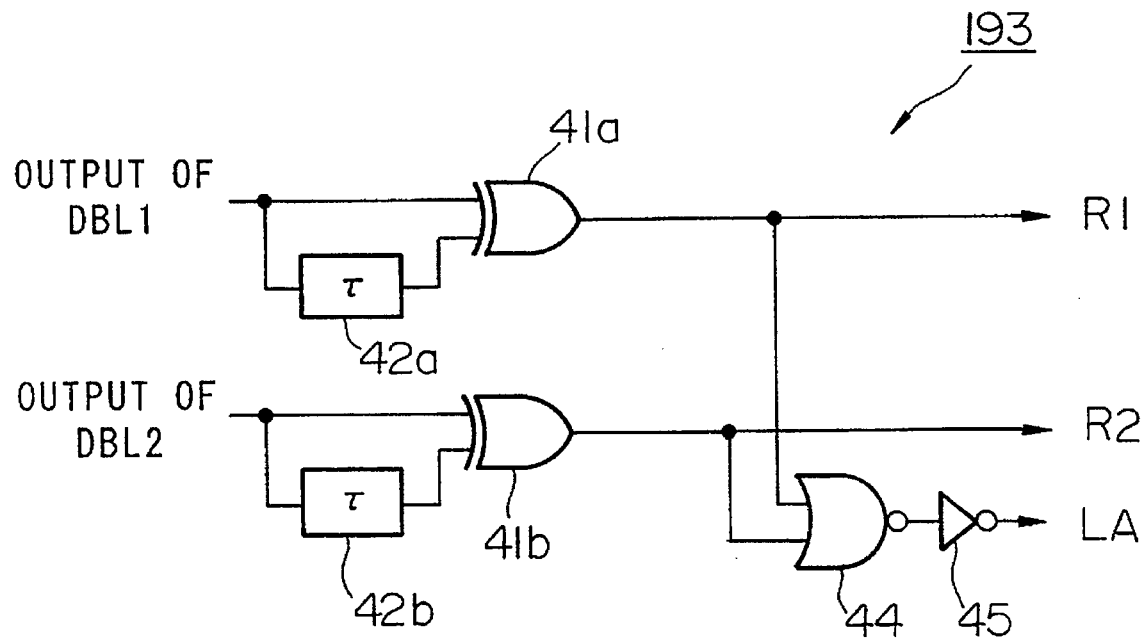
FIG. 4 is a circuit diagram showing an example of internal configuration of a sense-determination-pulse generating circuit in FIG. 3.

FIG. 4 is a circuit diagram showing an example configuration for the sense-determination-pulse generating circuit 193. When the dummy word lines DWL1 and DWL2 are selected by the driver 22 and are set at 'VSS' level, reduction of electric potential occurs on the dummy bit lines DBL1 and DBL2 due to "current-lead-in-shutdown" of the memory cell. The reduction of electric potential is detected by the dummy sense amplifier circuit 32. Output signals of the dummy bit lines DBL1 and DBL2 are respectively supplied to first inputs of exclusive-or gates 41a and 41b. In addition, they are respectively supplied to second inputs of the exclusive-or gates 41a and 41b through delay elements 42a and 42b. By intervention of the delay elements 42a and 42b, the exclusive-or gates 41a and 41b produce pulses R1 and R2 (see FIG. 6), each having a pulse width which is determined based on the delay times of the delay elements 42a and 42b. Those pulses R1 and R2 are sense-determination pulses.

The sense-determination pulses R1 and R2 are subjected to a logical sum operation performed which is by a NOR gate 44 and an inverter buffer 45. Thus, it is possible to produce a control pulse LA which controls the data latch circuit 16. Incidentally, the sense-determination pulses R1 and R2 are used as reset pulses for the driver 22 which drives the dummy word lines DWL1 and DWL2.

FIG. 5 is a block diagram showing an example configuration for the driver 22 which selectively drives the dummy cell arrays 21a and 21b of FIG. 2. The aforementioned address-transition detecting circuit 18 produces address-transition detecting pulses, represented by a symbol 'ATD', which are divided into odd-number-address-transition pulses ATDa and even-number-address-transition pulses ATDb by a counter 51. T-type flip-flops 51a and 51b respectively receive the pulses ATDa and ATDb so as to produce an L-level output. The L-level output is transmitted onto the dummy word lines DWL1 and DWL2 through buffers 52a and 52b, respectively. The T-type flip-flops 51a and 51b respectively uses the aforementioned sense-determination pulses R1 and RE as reset pulses.

Figure 6:
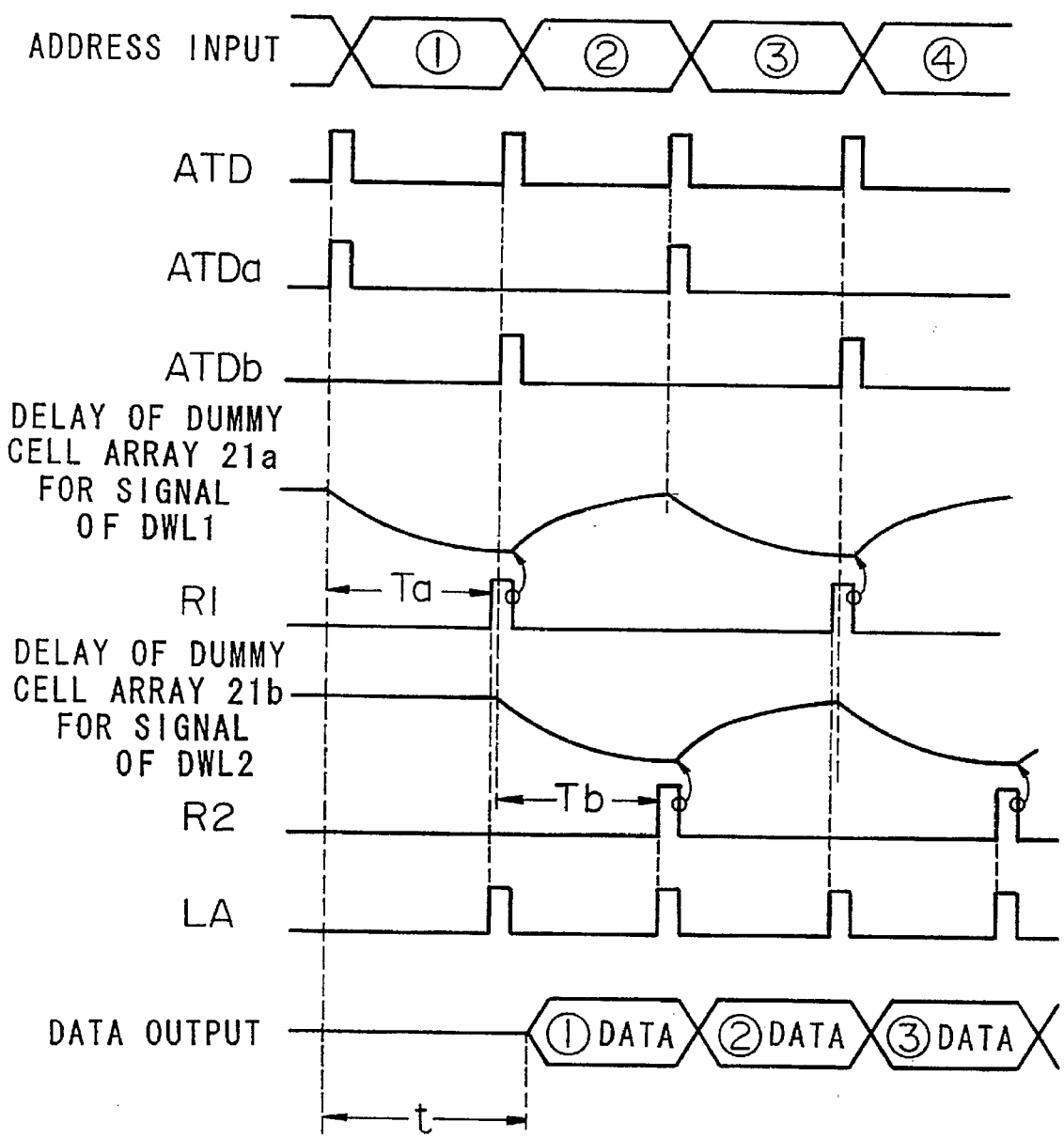
FIG. 6 is a timing chart which is used to explain operations of the embodiment.

Next, a data-read-out operation for the NAND-type mask which is configured as described above, will be described in detail with reference to the timing chart of FIG. 6. FIG. 6 shows a specific situation where external addresses $A_{IN}$ are supplied to the mask ROM in accordance with address cycles ①, ② . . . (see '$A_{IN}$'). Based on the address inputs, normal operations are performed to access the memory cell array 11, so that data-read-out operations are performed. At an address transition, an address-transition detecting pulse 'ATD' is produced. The address-transition detecting pulses are divided into odd-number-address-transition pulses 'ATDa' and even-number-address-transition pulses 'ATDb' by the counter 51 of FIG. 5. Thus, the dummy word lines DWL1 and DWL2 for the dummy cell arrays 21a and 21b are alternatively driven.

When electric potentials at the last stages of the dummy word lines DWL1 and DWL2 become lower than threshold levels, which are set for memory transistors provided at the last stages of the dummy word lines DWL1 and DWL2, increases of the electric potentials occur at the dummy bit lines DBL1 and DBL2 respectively. The increase of the electric potentials is detected by the dummy sense amplifier circuit 32. FIG. 6 shows schematic waveforms $Delay_1$ and $Delay_2$ representing a manner of sense delay of the dummy cell arrays 21a and 21b for the signals DWL1 and DWL2, respectively. Specifically, the sense-determination pulse R1 is obtained using a sense-delay time Ta provided for the first dummy cell array 21a which is driven based on the pulse ATDa, while the sense-determination pulse R2 is obtained using a sense-delay time Tb provided for the second dummy cell array 21b which is driven based on the pulse ATDb. Herein, the sense-delay time Tb is roughly equal to the sense-delay time Ta.

When the sense-determination pulse R1 occurs at the first dummy cell array 21a, the T-type flip-flop 51a, of FIG. 5, is reset at a trailing edge of the sense-determination pulse R1. Thus, drive of the first dummy cell array 21a is reset, so the first dummy cell array 21a can prepare for a next drive. Similarly, when the sense-determination pulse R2 occurs at the second dummy cell array 21b, the T-type flip-flop 51b, of FIG. 5, is reset at a trailing edge of the sense-determination pulse R2. Thus, drive of the second dummy cell array 21b is reset, so the second dummy cell array 21b can prepare for a next drive.

Through control pulses 'LA', each of which corresponds to the logical sum of the sense-determination pulses R1 and R2, data of the sense amplifier circuit 15 are sequentially inputted to the data latch circuit 6. Immediately after the data latch circuit 6 retains data of a cycle, read-out for data of a next cycle is started. As shown by FIG. 6, data of cycle ① are outputted from the data latch circuit 18 at the next cycle ② (see '$D_{out}$').

As described above, the present embodiment is designed as follows:

The data latch circuit 18 is provided to receive the output of the sense amplifier circuit 15; and the dummy cell arrays 21a and 21b are used to perform time measurement of the sense determination; thus, the output of the sense amplifier circuit 15 is retained by the data latch circuit 16.

The present embodiment is advantageous in that unlike in the conventional device, there is no need to provide a margin of time for the address cycle in connection with access time 't'; thus, data access can be made in a short cycle which is shorter than the access time t. In order to measure a delay time which elapses until the sense determination, the present embodiment uses the dummy cell arrays 21a and 21b, which are configured similar to the memory cell array, as well as the dummy column selector 31 and the dummy sense amplifier circuit 32. Therefore, it is possible to perform an accurate time measurement, without regard to the delay due to the output load capacity and output buffer. Thus, high-speed access can be achieved.

Figure 7:
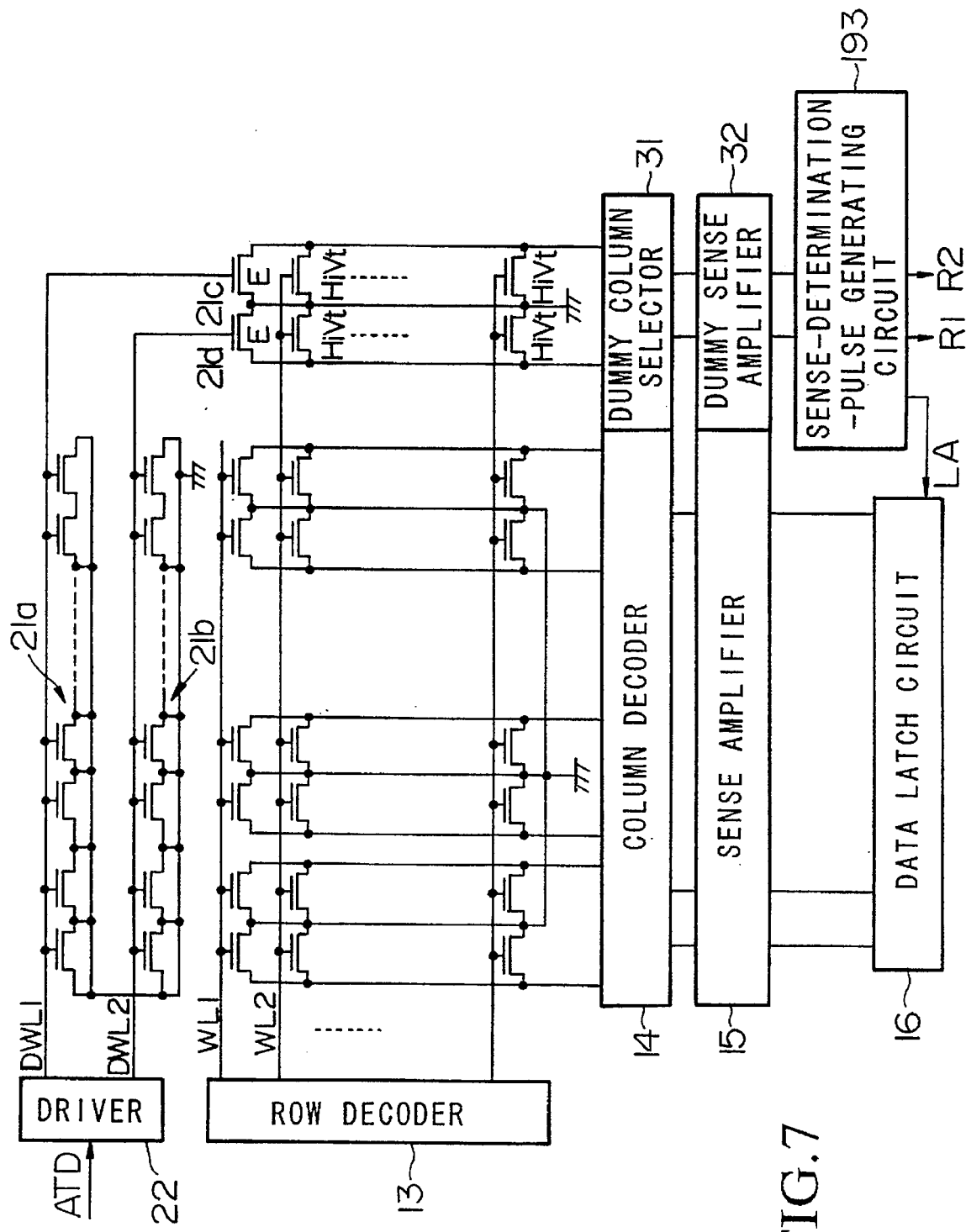
FIG. 7 is a block diagram showing an essential part of a mask ROM which is another embodiment of the present invention.

The present invention can be applied to other types of mask ROMs such as mask ROMs using NOR-type memory cells. An essential part of an embodiment, which realizes the mask ROM using the NOR-type memory cells, is shown by a block diagram in FIG. 7 (which corresponds to FIGS. 2 and 3). In FIG. 7 parts equivalent to those of FIGS. 2 and 3 will be designated with the same numerals; hence, detailed description thereof will be omitted.

All of the memory cells of the dummy cell arrays 21a and 21b are subjected to 'HiVt' treatment in which the threshold voltage is raised up, wherein 'Vt' indicates the threshold voltage. The dummy cell arrays are configured similar to the memory cell arrays and the memory cells are connected in parallel along with the dummy word lines DWL1 and DWL2. Sources and drains of the dummy cell arrays 21a and 21b are grounded. The dummy word lines DWL1 and DWL2 are connected to gates of the memory transistors which are arranged at first stages of dummy cell arrays 21c and 21d. Each of the dummy cell arrays 21c and 21d is configured by memory transistors which are arranged like the memory cell array in its column direction. Only the memory transistors, which are arranged at the first stages of the dummy cell arrays 21c and 21d, are of enhancement type, while other memory transistors are subjected to HiVt treatment. Different from the aforementioned NAND-type memory cell, the NOR-type memory cell is configured in such a way that a word-line-selection mode is set at 'H' level and a word-line-non-selection mode is set at 'L' level.

Like the aforementioned embodiment, the embodiment of FIG. 7 is advantageous in that the address cycle is not restricted by the access time and high-speed data-read-out operations can be achieved.

Additionally, application of the present invention is not limited to the mask ROMs. The invention can be applied to all types of ROMs, such as PROMs and EPROMs, as well as SRAMs and DRAMs. Even if the present invention is applied to those kinds of memories, it is possible to demonstrate the same effects described heretofore.

As this invention may be embodied in several forms without departing from the spirit of essential characteristics thereof, the embodiments are therefore illustrative and not restrictive, since the scope of the invention is defined by the appended claims rather than by the description preceeding them, and all changes that fall within meets and bounds of the claims, or equivalence of such meets and bounds are therefore intended to be embraced by the claims.

What is claimed is:

1. A semiconductor storage device comprising:

a memory cell array for storing data;

an address buffer for receiving addresses;

a decoder for accessing the memory cell array by decoding the received addresses;

sense amplifier means for reading out data, which are selected by the addresses, from the memory cell array;

address-transition detecting means for detecting variation between the addresses which are received by the address buffer so as to produce address-transition detecting pulses;

first delay means for detecting a first time which elapses until determination of output of the sense amplifier means with respect to data selected by an address corresponding to an odd-number-address-transition detecting pulse of the address-transition detecting pulses;

second delay means for detecting a second time which elapses until determination of output of the sense amplifier means with respect to data selected by an address corresponding to an even-number-address-transition detecting pulse of the address-transition detecting pulses;

sense-determination-pulse generating means for generating sense-determination pulses based on outputs of the first and second delay means; and a data latch circuit for retaining output of the sense amplifier means in response to the sense-determination pulses.

2. The semiconductor storage device according to claim 1, wherein the first and second delay means comprise:

dummy cell arrays which are configured similar to the memory cell array, dummy-word-line driving means for selectively driving dummy word lines of the dummy cell arrays according to the address-transition detecting pulses, a dummy column selector and dummy sense amplifier means which are connected with dummy bit lines that extend from the dummy cell arrays, wherein the sense-determination-pulse generating means detects variation of outputs of the dummy sense amplifier means so as to generate sense-determination pulses each having a certain pulse width.

3. The semiconductor storage device according to claim 1, wherein the first and second delay means comprise:

first and second dummy cell arrays which are configured by NAND-type memory cells similar to those of the memory cell array, dummy-word-line driving means for selectively driving certain dummy word lines, which are selected from among dummy word lines of the first and second dummy cell arrays, by the odd-number-address-transition detecting pulse and the even-number-address-transition detecting pulse, and for applying a power supply voltage to the dummy word lines other than the certain dummy word lines, a dummy column selector and dummy sense amplifier means which are connected with dummy bit lines that extend from NAND-type memory cells which are arranged at last stages of the first and second dummy cell arrays, wherein the sense-determination-pulse generating means detects variation of output of the dummy sense amplifier means so as to generate the sense-determination pulses each having a certain pulse width.

* * * * *